United States Patent [19]
Abramian

[11] 4,409,492
[45] Oct. 11, 1983

[54] SHOCK EXCITED PULSE TRANSFORMER

[75] Inventor: Evgeny A. Abramian, Moscow, U.S.S.R.

[73] Assignee: Institut Vysokikh Temperatur Akademii Nauk SSSR, Moscow, U.S.S.R.

[21] Appl. No.: 336,351

[22] PCT Filed: May 5, 1980

[86] PCT No.: PCT/SU80/00074
§ 371 Date: Jan. 4, 1982
§ 102(e) Date: Jan. 4, 1982

[87] PCT Pub. No.: WO81/03254
PCT Pub. Date: Nov. 12, 1981

[51] Int. Cl.³ .............................................. H02M 9/02
[52] U.S. Cl. .................................. 307/108; 323/361; 328/233
[58] Field of Search ................. 313/359.1; 328/233, 328/258; 307/106, 108; 323/361

[56] References Cited
U.S. PATENT DOCUMENTS
3,343,007  9/1967  Massey ................................. 307/108
3,450,996  6/1969  Abramyan et al. .............. 313/359.1

Primary Examiner—William H. Beha, Jr.
Attorney, Agent, or Firm—Lilling & Greenspan

[57] ABSTRACT

The shock excited pulse transformer comprises at least two stages, each having a primary winding equipped with a capacitor and a switch device and a secondary winding. The second windings are connected in series and in all stages except the last one are coiled with two parallel conductors insulated from each other. In the first stage one conductor is connected to the output of the charging device and the other is grounded, whereas in all other stages capacitors 7 of the circuits of the primary windings 2 are inserted between these conductors in parallel.

The shock excited pulse transformer is basically designed for supply of acceleration tubes.

2 Claims, 2 Drawing Figures

SHOCK EXCITED PULSE TRANSFORMER

FIELD OF THE INVENTION

The invention relates to high-voltage pulse power sources and, more particularly, to shock excited pulse transformers.

DESCRIPTION OF THE PRIOR ART

Known in the art is a shock excited pulse transformer comprising a charging unit, a capacitor bank, and primary and secondary windings. This transformer is capable of generating a pulse voltage whose amplitude can reach many hundreds of kilovolts and the repetition frequency is extremely high /cf., for example, USSR Inventor's Certificate No. 224,712/.

The self resonant frequency of such a transformer is, however, very low and, consequently, the high voltage pulse becomes longer, of the order of $10^{-6}$–$10^{-5}$ sec. This can be attributed to the fact that a higher transformation ratio, in other words a greater number of turns in the secondary winding, is required to provide high voltage in one stage. The inductance of the secondary winding increases, whereas the natural frequency goes down.

Also known in the art is a shock excited pulse transformer comprising a charger, primary and secondary windings, a capacitor and a switch mechanism fitted into the primary winding circuit. There is also an additional discharger in the secondary winding circuit, which reduces the time of connection of the load (accelerating tube) and, consequently, makes for a shorter, up to $10^{-7}$ sec., duration of the high-voltage pulse (cf. the USSR Inventor's Certificate No. 304,895).

Unfortunately, the repetition frequency in such a transformer is limited because of the complicated frequency operation of the additional discharger rated for the entire high-voltage range.

SUMMARY OF THE INVENTION

The invention consists of providing a shock excited pulse transformer whose fairly simple circuitry can make for generation of short, up to $10^{-7}$ sec., high-voltage pulses with a high, up to $10^3$ Hz, repetition frequency of these pulses.

This object is achieved by a shock excited pulse transformer comprising a primary winding, a secondary winding, a capacitor, a charging device and a switch mechanism in the primary winding circuit; According to the invention, the transformer has at least two stages, each comprising a primary winding equipped with a capacitor and a switch mechanism and a secondary winding; The secondary windings are connected in series in all stages, except the last one, and coiled by two parallel and insulated from each other conductors which are in the first stage connected, one to the output of the charging device and the other to the ground, in all other stages capacitors of the primary winding circuits are inserted in parallel between these conductors.

Each stage, except the first one, should be, preferably, provided with an additional winding connected parallel to the switch mechanism and inductively coupled to the secondary winding of the preceding adjacent stage.

The shock excited pulse transformer made in accordance with this invention generates high-voltage pulses whose repetition frequency can go up to $10^3$ Hz and whose duration is about $10^{-7}$ seconds and is highly reliable, though the circuitry is rather simple.

BRIEF DESCRIPTION OF THE DRAWINGS

Given hereinbelow is a detailed description of embodiments of the present invention with reference to the accompanying drawings, wherein.

DETAILED DESCRIPTION OF THE INVENTION

Figure 1:
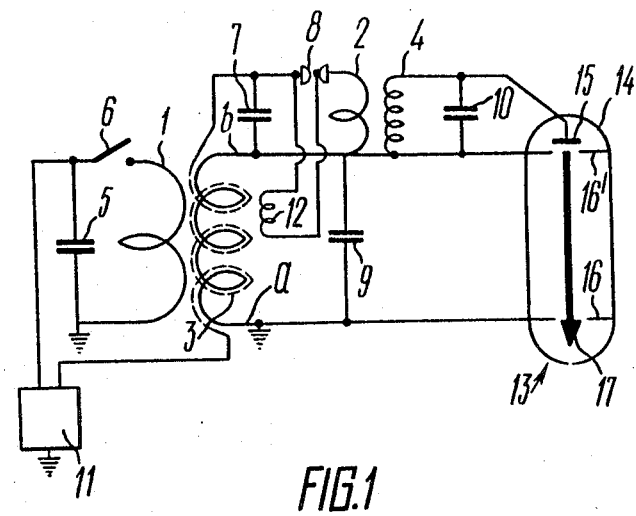
FIG. 1 is a schematic circuit diagram of a shock excited transformer having two stages, according to the invention.

The embodiment shown in a pulse transformer of FIG. 1 comprises primary windings 1 and 2, secondary windings 3 and 4, a capacitor 5 and a switch mechanism 6 in the circuit of the primary winding 1, a capacitor 7 and a switch mechanism 8 in the circuit of the primary winding 2, and capacitors 9 and 10 in the circuit of the secondary winding 3 and of the secondary winding 4, respectively. The pulse transformer has a charging device for charging the capacitors 5 and 7. The first stage comprises the windings 1 and 3, the capacitor 5, the capacitor 9 and the switch mechanism 6. The second stage comprises the windings 2 and 4, the capacitor 7, the capacitor 10 and the switch device 8. The secondary windings 3 and 4 of the two stages are connected in series. The secondary winding 3 is coiled by two parallel conductors insulated from each other. At one end of the winding 3, one conductor is connected to the charging device 11 and the other conductor is grounded. At the other end of the winding 3, both conductors are coupled to the plates of the capacitor 7. The second stage comprises an additional winding 12 connected in parallel with the switch mechanism 8 and inductively coupled to the secondary winding 3. Referring to FIG. 1, the pulse transformer has a load, in this case it is an acceleration tube comprising a cathode 15 and electrodes 16 and 16' in a vacuum bulb. The acceleration tube is inserted between the beginning "a" of the secondary winding 3 of the first stage and the end of the secondary winding 4 of the second stage and, consequently, the voltage of the load is equal to the sum of voltages of the secondary windings 3 and 4 of both stages.

In order to improve separation of high voltage of the acceleration tube 13, voltage from the end "b" of the secondary winding 3 of the first stage can be also supplied to the intermediate electrode 16', as shown in FIG. 1.

When high voltage is applied to the acceleration tube 13, an electron beam 17 is accelerated therein.

An embodiment of a shock excited pulse transformer comprises, unlike the embodiment of FIG. 1, one more, that is, a third stage, composed of a primary winding 18, a secondary winding 19, a capacitor 20 and a switch mechanism 21 in the circuit of the primary winding 18 and a capacitor 22 in the circuit of the secondary winding 19. The secondary winding 4 of the second stage in this embodiment, like the secondary winding 3 of the first stage, is coiled by two parallel conductors insulated from each other. At one end of the winding 4 conductors are connected in series to conductors of the winding 3. At the other end of the winding 4 the conductors are connected to the plates of the capacitor 20 in the circuit of the primary winding 18 of the third stage. The secondary winding 19 of the last third stage is coiled in a standard manner by one conductor and is connected in series to the winding 4. The third stage has, similar to the second stage, an additional winding 23 connected in parallel to the switch mechanism 21 and inductively coupled to the secondary winding 4 of the second stage. The load, the acceleration tube 13, in this three-stage transformer has two intermediate electrodes 16' and 16" connected to the end of the secondary winding 4 and to the end of the secondary winding 3, respectively. The acceleration tube is inserted between the beginning of the winding 3 and the end of the winding 19.

The two-stage circuit (FIG. 1) operates as follows.

The capacitors 5 and 7 are both charged from one device 11. The double conductor of the secondary winding 3 is used to connect the capacitor 7 to the charging device 11. The switch mechanism 6 is equipped with a means for turning on at a specific moment. The switch devices 6 and 8 can be hydrogen thyrotrons, trigatrons, thyristors and other similar devices. Energy fed from the charging device 11 to the capacitor 7, which is under high voltage during operating pulses, can be utilized to energize the cathode filament and other elements of the switch mechanism 8 or other devices in the second stage.

The capacitors 5 and 7 are charged from the device 11 to a specific voltage. The switch mechanism 6 is turned on. As capacitor 5 is discharged to the primary winding 1, high voltage is induced in the secondary winding 3. Voltage is also inducted in the additional winding 12. This voltage is applied to the switch mechanism 8 of the second stage and turns the mechanism on. Since the free-resonant frequencies of the primary and secondary circuits of the primary and secondary windings in both stages of the transformer are equal and the coupling coefficient is rather high, the bulk of energy accumulated in the capacitors 5 and 7 in the second and third half-cycles is transferred to the capacitors 9 and 10 and can be then transmitted to the load, the electron beam 17.

Figure 2:
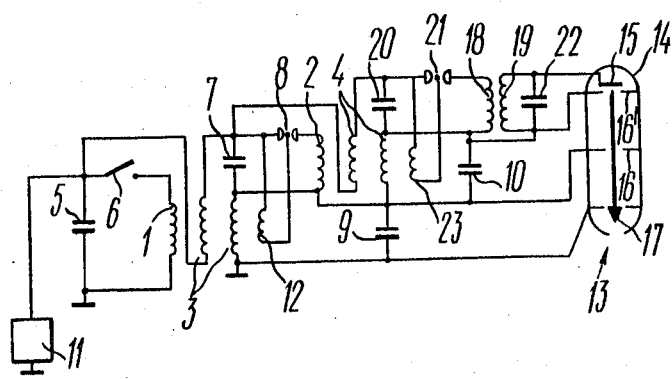
FIG. 2 is a schematic circuit diagram of a shock excited transformer having three stages, according to the invention.

The three-stage circuit (FIG. 2) operates very similarly. The capacitors 5,7 and 20 are charged from the charging device 11 and the switch mechanisms 6,8 and 21 are turned on at specific moments.

In general, the following considerations are taken into account to select the number of stages in the transformer circuit.

Voltage generated by each stage is determined by the voltage at the primary winding thereof and the transformation ratio which cannot be too high to achieve short duration of pulses. The number of stages of a transformer circuit is, therefore, determined by the total voltage to be generated by the transformer. Thus, for example, with the primary winding voltage of 50 kw, the desired pulse duration of $10^{-7}$ sec and the transformation ratio equal to 4, five stages are required to produce 1 MV voltage.

In the proposed invention each stage of the transformer can have few turns in the primary and secondary windings and, consequently, the natural frequencies of stage circuits can be higher like the repetition frequency and the high voltage pulse can be shorter in secondary windings and the load (acceleration tube). Moreover, the moment of turning each stage on is adjustable by means of switch devices 6,8 and 21 and electrons, for example, can be injected into the acceleration tube after the voltage in the secondary winding of the preceding stage comes close to maximum. The natural frequency of the last stage of the transformer should sometimes be higher than of the first stage in order to produce a narrow electron beam pulse close to maximum voltage at the first stages. The energy of accelerated electrons can, consequently, be almost constant.

INDUSTRIAL APPLICABILITY

The proposed pulse transformer can be used for supplying to acceleration tubes and other devices short duration pulse voltages characterized by a high repetition frequency.

I claim:

1. A shock excited pulse transformer comprising a primary winding, a secondary winding, a capacitor, a charging device and a switch mechanism in the circuit of the winding, wherein the improvement comprises at least two stages, each having a primary winding equipped with a capacitor and a switch device and a secondary winding, the secondary windings being connected in series and in all stages except the last one coiled with two parallel conductors insulated from each other, in the first stage a first conductor is connected to an output of the charging device and a second conductor is grounded, and in all other stages capacitors of the circuits of the primary windings are inserted between said conductors in parallel.

2. A shock excited pulse transformer as claimed in claim 1, wherein each stage except the first stage comprises an additional winding connected in parallel with the switch mechanism and inductively coupled to the secondary winding of the preceding adjacent stage.

* * * * *